(12) United States Patent
Seo et al.

(10) Patent No.: US 10,045,468 B2
(45) Date of Patent: Aug. 7, 2018

(54) ELECTRONIC DEVICE WITH SHIELD STRUCTURE

(71) Applicant: Samsung Electronics Co., Ltd., Gyeonggi-do (KR)

(72) Inventors: Hyun-Min Seo, Seoul (KR); Jun-Taek Oh, Seoul (KR); Jin-Woo Kim, Seoul (KR); So-Young Lee, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/271,620

(22) Filed: Sep. 21, 2016

(65) Prior Publication Data

US 2017/0150657 A1 May 25, 2017

(30) Foreign Application Priority Data

Nov. 20, 2015 (KR) .......................... 10-2015-0163282

(51) Int. Cl.
| | |
|---|---|
| *H05K 9/00* | (2006.01) |
| *H05K 7/14* | (2006.01) |
| *H05K 1/18* | (2006.01) |
| *H05K 1/02* | (2006.01) |
| *H05K 1/14* | (2006.01) |

(52) U.S. Cl.
CPC .......... *H05K 9/0026* (2013.01); *H05K 1/028* (2013.01); *H05K 1/14* (2013.01); *H05K 1/181* (2013.01); *H05K 7/1427* (2013.01); *H05K 2201/10522* (2013.01)

(58) Field of Classification Search
CPC .. H05K 9/0026; H05K 9/0024; H05K 9/0028; H05K 2201/10371; H05K 9/0032; H05K 1/144; Y10S 174/34
USPC ........................................ 361/818, 800, 816
See application file for complete search history.

(56) References Cited

U.S. PATENT DOCUMENTS

| | | | |
|---|---|---|---|
| 6,930,891 B1 * | 8/2005 | Hama ................... | H05K 9/0026 174/359 |
| 2004/0264156 A1 * | 12/2004 | Ajioka ................... | H01L 23/552 361/818 |
| 2005/0052858 A1 * | 3/2005 | Shima .................... | H04B 15/00 361/814 |
| 2011/0155445 A1 | 6/2011 | Kwon et al. | |
| 2013/0016484 A1 * | 1/2013 | Yoo ....................... | H05K 9/0028 361/752 |

(Continued)

FOREIGN PATENT DOCUMENTS

| KR | 10-2011-0073663 A | 6/2011 |
|---|---|---|
| KR | 10-1430188 B1 | 8/2014 |

*Primary Examiner* — Steven T Sawyer
(74) *Attorney, Agent, or Firm* — Cha & Reiter, LLC.

(57) ABSTRACT

A shield structure including a metallic plate that is disposed between the first electronic component and the second electronic component; a first side wall that encloses at least a portion of the first electronic component, and includes a first portion that is formed by a portion that extends from the peripheral edge of the metallic plate and is formed by being bent in the first direction; and a second side wall that encloses at least a portion the second electronic component, and includes a second portion that is formed by a portion that extends from the peripheral edge of the metallic plate and is formed by being bent in the second direction.

19 Claims, 7 Drawing Sheets

(56) References Cited

U.S. PATENT DOCUMENTS

2014/0098509 A1* 4/2014 Tomoe ................ H04M 1/0277
361/803
2014/0168908 A1* 6/2014 Chuang ................ H05K 1/0218
361/735

* cited by examiner

ELECTRONIC DEVICE WITH SHIELD STRUCTURE

CLAIM OF PRIORITY

This application claims the priority under 35 U.S.C. § 119(a) to Korean Application Serial No. 10-2015-0163282, which was filed in the Korean Intellectual Property Office on Nov. 20, 2015, the entire contents of which are hereby incorporated by reference.

TECHNICAL FIELD

The present disclosure generally relates to an electronic device, and more particularly to an electronic device that includes a shield structure.

BACKGROUND

An electronic device refers to a device that performs a specific function according to an equipped program, such as an electronic scheduler, a portable multimedia reproducer, a mobile communication terminal, a tablet PC, an image/sound device, a desktop/laptop PC, or a vehicular navigation system, as well as a home appliance. For example, such an electronic device may output information stored therein as sound or an image. Increasingly, as super high speed and large capacity wireless communication have become popular, electronic devices are becoming more multi-functional including providing a function as a mobile communication terminal. For example, a single electronic device that includes a communication function may also include a variety of other functions, such as an entertainment function (e.g., a game function), a multimedia function (e.g., a music/video reproducing function), a communication and security function for mobile banking, a schedule management function, and an e-wallet function.

Such an electronic device may be equipped with electronic components for implementing a communication function, a multimedia function, or the like, and a printed circuit board, on which the electronic components are mounted. While some electronic components are operated, electromagnetic waves may be generated. These electromagnetic waves may affect the operations of other electronic components.

SUMMARY

Electronic components of an electronic device may be mounted on both sides of a printed circuit board. Doing so may facilitate miniaturizing the electronic device. However, there may be a difficulty in provided a space in which the printed circuit board and the electronic components may be disposed. Moreover, as the electronic device incorporates an increasing number of electronic components, electromagnetic wave interference between electronic components, which may degrade the performance of the electronic device, is becoming a greater problem. In order to arrange the printed circuit board and the electronic components within a limited space of the electronic device, two printed circuit boards may be formed in a stacked structure, in which the printed circuit boards face each other. The electronic components may be arranged on the facing faces of the two printed circuit boards such that the electronic devices face each other. Each of the electronic components may be covered by a shield structure.

Various embodiments of the present disclosure may provide an electronic device that is able to be miniaturized and reduced in weight by reducing a space that would otherwise need to be occupied by a shield structure by configuring the electronic components to share the same shield structure.

Various embodiments of the present disclosure may provide an electronic device that is provided with a shield structure, which may be relatively easily installed between the facing faces of two printed circuit boards.

According to various embodiments, an electronic device may include: a housing that includes a first face that faces a first direction, and a second face that faces a second direction, which may be opposite to the first direction; a first printed circuit board that includes a first face that faces the first direction, and a second face that is included within the housing and faces the second direction; a second printed circuit board that is disposed between the second face of the housing and the second face of the first printed circuit board, and includes a first face that faces the first direction and a second face that faces the second direction; at least one first electronic component that is disposed on the second face of the first printed circuit board; at least one second electronic component that is disposed on the first face of the second printed circuit board to be adjacent to the first electronic component; a shield structure that electromagnetically shields the first electronic component and the second electronic component.

The shield structure may include: a metallic plate that is disposed between the first electronic component and the second electronic component; a first side wall that encloses at least a portion of the first electronic component, and may include a first portion that is formed by a portion that extends from the periphery of the metallic plate and is formed by being bent in the first direction; and a second side wall that encloses at least a portion of the second electronic component, and includes a second portion that is formed by another portion that extends from the periphery of the metallic plate and is formed by being bent in the second direction.

According to various embodiments of the present disclosure, the electronic device have the same shield structure for each of the first printed circuit board and the second printed circuit board. Accordingly, it is possible to reduce the height between the first printed circuit board and the second printed circuit board since separate shield structures for each of the first and second printed circuit boards are not necessary.

In addition, according to various embodiments of the present disclosure, the electronic device may be configured to reduce the connecting members that interconnect the printed circuit boards and the shield members. Accordingly, it is possible to reduce the time and cost that are required for installing the shield structures.

These and other features of the present disclosure are more fully described hereinbelow.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Figure 1:
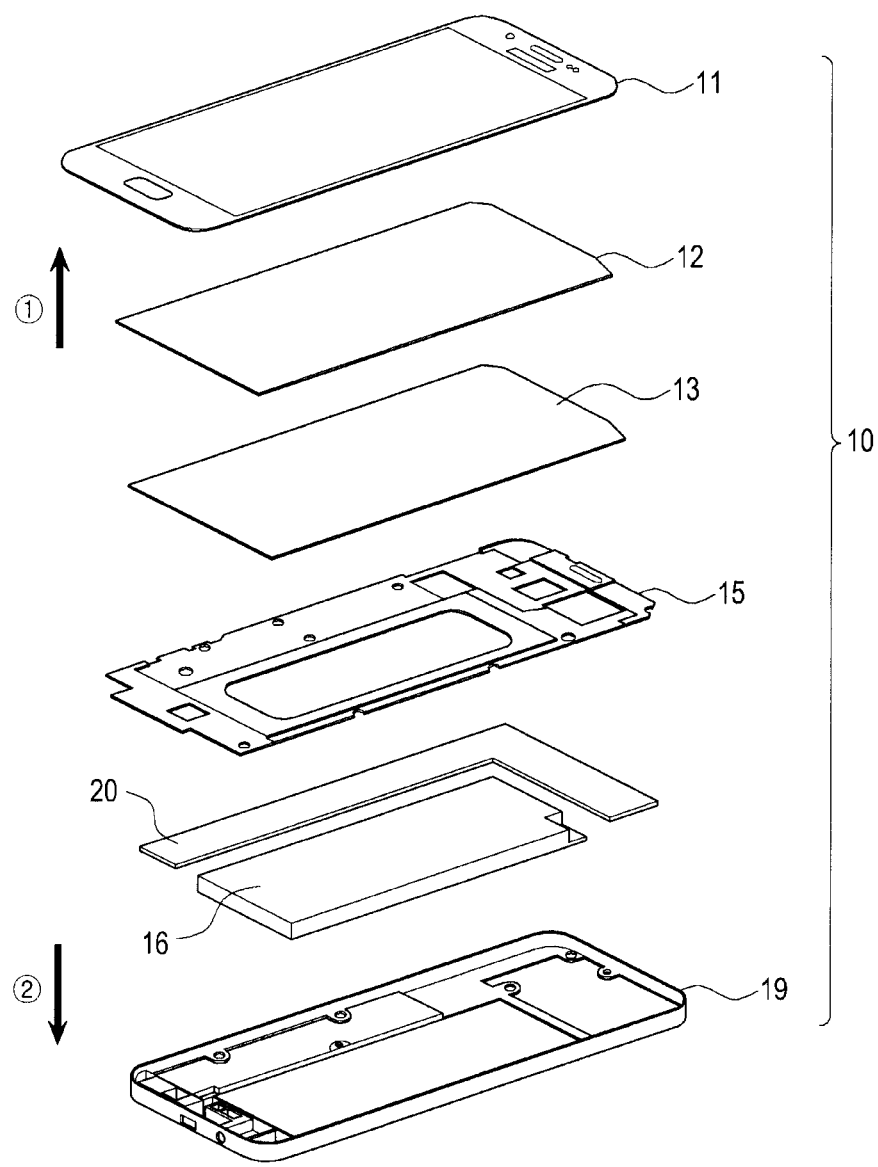
FIG. 1 is an exploded perspective view illustrating an electronic device according to various embodiments of the present disclosure.

Hereinafter, various embodiments of the present disclosure will be described with reference to the accompanying drawings. It shall be understood that an embodiment and terms for describing the embodiment are not intended to limit the techniques disclosed herein to the specific embodiment, and various modifications, equivalents, and/or substitutions of the corresponding embodiment may be made to the corresponding embodiment. In describing the drawings, similar reference numerals may be used to designate similar constituent elements. Singular forms may include plural forms unless the context clearly indicates otherwise. According to various embodiments of the present disclosure, the expressions "A or B," or "at least one of A and/or B," and the like may include all combinations of the listed items. The expression "a first", "a second", "the first", or "the second" may modify corresponding elements regardless of the order or importance, and is used only to distinguish one element from another element, but does not limit the corresponding elements. When an element (e.g., first element) is referred to as being "(functionally or communicatively) connected," or "directly coupled" to another element (second element), the element may be connected directly to the another element or connected to the another element through yet another element (e.g., third element).

The expression "configured to" as used in various embodiments of the present disclosure may be interchangeably used with, for example, "suitable for", "having the capacity to", "designed to", "adapted to", "made to", or "capable of" in terms of hardware or software, according to circumstances. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

An electronic device according to various embodiments of the present disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), a MPEG-1 audio layer-3 (MP3) player, a mobile medical device, a camera, and a wearable device. The wearable device may include at least one of an accessory type (e.g., a watch, a ring, a bracelet, an anklet, a necklace, a glasses, a contact lens, or a Head-Mounted Device (HMD)), a fabric or clothing integrated type (e.g., an electronic clothing), a body-mounted type (e.g., a skin pad, or tattoo), and a bio-implantable type (e.g., an implantable circuit). In some embodiments, the electronic device may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

In other embodiments, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyrocompass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.). According to some embodiments, an electronic device may include at least one of a part of furniture or a building/structure, an electronic board, an electronic signature receiving device, a projector, and various types of measuring instruments (e.g., a water meter, an electric meter, a gas meter, a radio wave meter, and the like). In various embodiments, the electronic device may be flexible, or may be a combination of one or more of the aforementioned various devices. The electronic device according to various embodiments of the present disclosure is not limited to the above described devices. The term "user" as used in various embodiments of the present disclosure may refer to a person who uses an electronic device or a device (for example, an artificial intelligence electronic device) that uses an electronic device.

In the present disclosure, the terms are used to describe specific embodiments, and are not intended to limit the present disclosure. As used herein, the singular forms are intended to include the plural forms as well, unless the context clearly indicates otherwise. In the description, it should be understood that the terms "include" or "have" indicate existence of a feature, a number, a step, an operation, a structural element, parts, or a combination thereof, and do not previously exclude the existences or probability of addition of one or more another features, numeral, steps, operations, structural elements, parts, or combinations thereof.

Unless defined differently, all terms used herein, which include technical terminologies or scientific terminologies, have the same meaning as that understood by a person skilled in the art to which the present disclosure belongs. Such terms as those defined in a generally used dictionary are to be interpreted to have meanings equal to the contextual meanings in the relevant field of art, and are not to be interpreted to have ideal or excessively formal meanings unless clearly defined in the present specification. In some cases, terms defined in this specification may not be interpreted as excluding embodiments of the present disclosure.

FIG. 1 is an exploded perspective view illustrating an electronic device according to various embodiments of the present disclosure.

Referring to FIG. 1, according to various embodiments of the present disclosure, an electronic device 10 may include a front cover 11, a touch panel 12, a display device 13, a support member 15, a battery 16, and a printed circuit board 20, and. In the present embodiment, descriptions will be made, assuming that the electronic device 10 is a smart phone, as an example.

The front cover 11 is configured to protect the inside of the electronic device 10 while forming the front face of the electronic device 10. The front cover 11 may be formed of glass or a synthetic resin (e.g., acryl or polycarbonate) in order to protect the display device 13 from the external environment while transmitting an image of a screen that is output from the display device 13. While the present embodiment exemplifies that the front cover 11 has a flat plate shape, at least a portion of the front cover 11 (e.g., opposite side ends) may be formed in curved surfaces such that the front cover 11 may have a three-dimensional shape.

The touch panel 12 may be disposed on the internal face of the front cover 11 so as to perform the function of an input device. The touch panel 12 may be fabricated integrally with the front cover 11.

The display device 13 may include a Liquid Crystal Display (LCD), a Light Emitting Diode (LED) display, an Organic Light Emitting Diode (OLED) display, a Micro-ElectroMechanical System (MEMS), or an electronic paper display. The display device 13 may output various contents (e.g., a photograph and a video image), and may output execution screens of various applications (e.g., a game application, an internet banking application, and a schedule management application). The display device 13 may be fabricated integrally with the touch panel 12, and may also be fabricated integrally with the front cover 11 when the touch panel 12 is integrated with the front cover 11. For example, the front cover 11, the touch panel 12, and the display device 13 may be fabricated as a structure in which the front cover 11, the touch panel 12, and the display device 13 are sequentially stacked. However, the front cover 11, the touch panel 12, and the display device 13 are not limited to the sequentially stacked structure and may be arranged differently.

The support member 15 may be provided on the rear face of the display device 13 so as to provide the rigidity of the electronic device 10 while supporting the display device 13. The support member 15 may be formed of a substantially rigid material, such as, for example a metal material. Without being limited thereto, however, the support member 15 may be formed of various other substantially rigid materials, such as, for example, a rigid plastic.

Various electronic components (e.g., a processor, a communication module, and a storage module) may be mounted on the printed circuit board 20. The printed circuit board 20 may be disposed in a region around the battery 16 on the rear face of the support member 15. The printed circuit board 20 may be disposed at any of various positions, such as the rear face of the support member 15, without being limited to being disposed on the rear face of the support member 15.

The battery 16 may be disposed on the rear face of the support member 15, and may be electrically connected to the printed circuit board 20 so as to supply power that is required for the electronic components that are mounted on the printed circuit board 20.

The rear cover 19 may be capable of protecting the rear face of the electronic device 10 by being disposed on the rear face of the battery 16. The rear cover 19 may be made of a substantially rigid material, such as, for example, metal and/or a portion of the side faces of the rear cover 19 (e.g., the rim of the rear cover) may be made of a substantially rigid material, such as, for example, metal.

The front cover 11 and the rear cover 19 may form a housing that forms the external appearance of the electronic device 10. For example, a first face of the housing, which faces a first direction ① (e.g., the direction that faces the front face of the housing) may be formed on the front cover 11, and a second face of the housing, which faces a second direction ② that is opposite to the first direction CD, may be formed on the rear cover 19.

Figure 2:
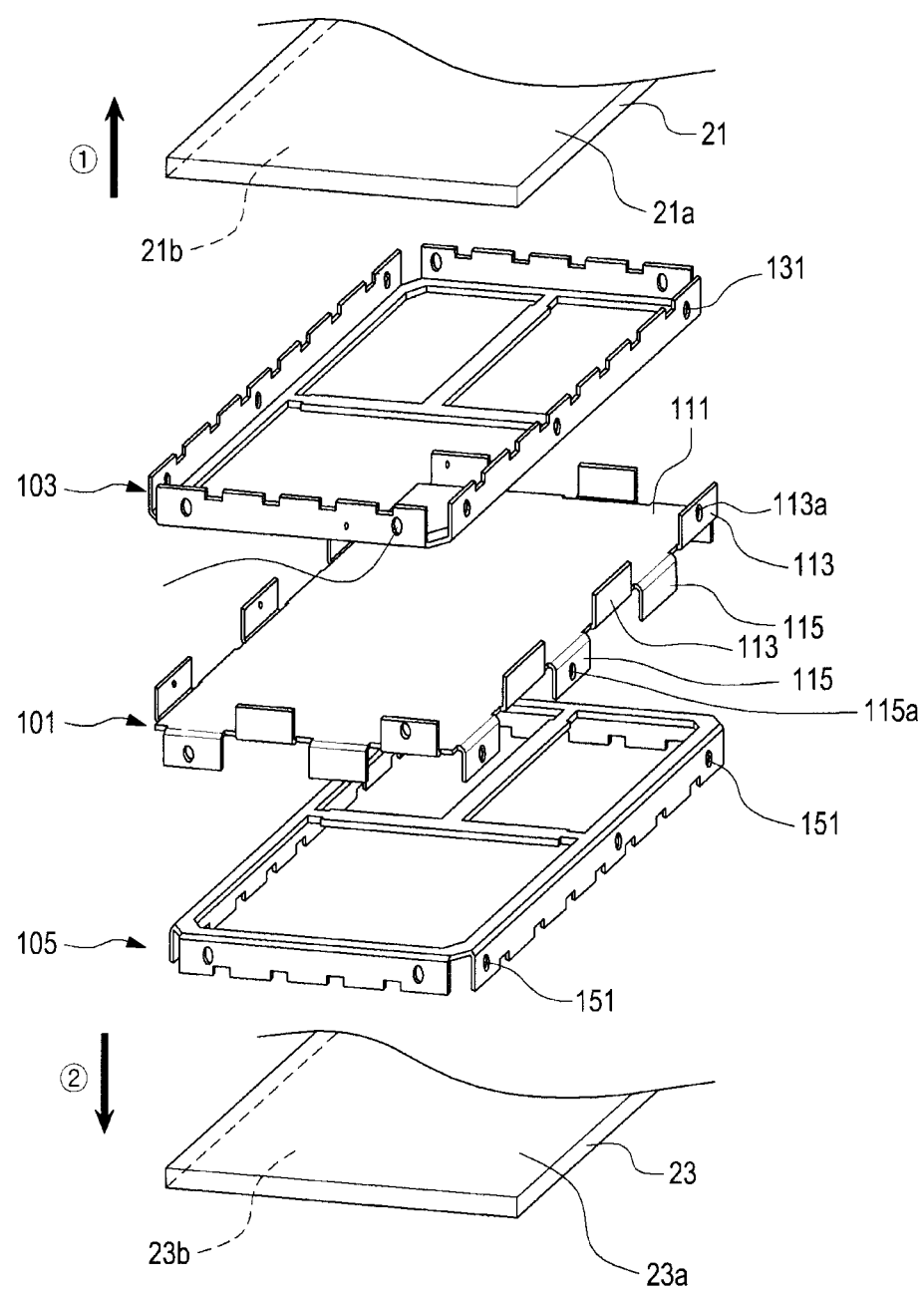
FIG. 2 is an exploded perspective view illustrating main components of an electronic device according to a first one of various embodiments of the present disclosure.
Figure 3:
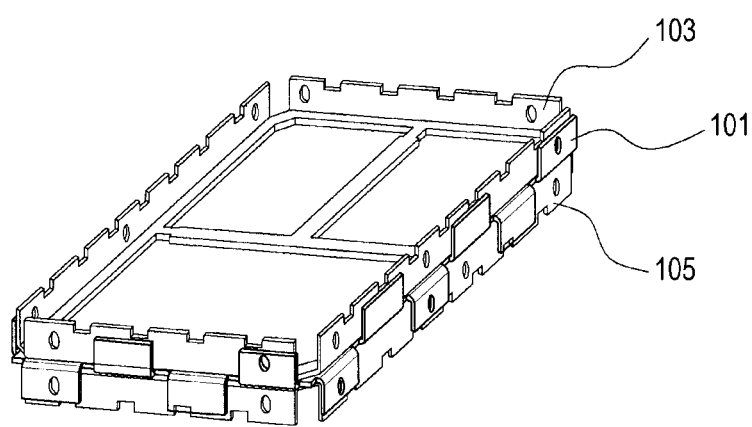
FIG. 3 is a perspective view illustrating a metallic plate and first and second frames of the electronic device according to the first one of various embodiments of the present disclosure, which are illustrated in FIG. 2, in a state where the metallic plate and the first and second frames are coupled to each other.

FIG. 2 is an exploded perspective view illustrating main components of an electronic device according to a first one of various embodiments of the present disclosure. FIG. 3 is a perspective view illustrating a metallic plate and first and second frames of the electronic device according to the first one of various embodiments, which is illustrated in FIG. 2, in a state where the metallic plate and the first and second frames are coupled to each other.

Referring to FIGS. 2 and 3, according to the first one of various embodiments of the present disclosure, an electronic device may include a first printed circuit board 21, a second printed circuit board 23, a shield structure 101, a first frame 103, and a second frame 105.

The first printed circuit board 21 may include a first face 21a that faces the first direction (e.g., the first direction ① in FIG. 1) and a second face 21b that faces the second direction (e.g., the second direction ② in FIG. 1). First electronic components (not illustrated) (e.g., a processor and a communication module) may be mounted on at least one face of the first printed circuit board 21 (e.g., the second face 21b) such that the first printed circuit board 21 may be provided as a main printed circuit board of the electronic device. The first printed circuit board 21 may substantially similar to the printed circuit board 20 illustrated in FIG. 1.

The second printed circuit board 23 may include a first face 23a that faces the first direction (e.g., the first direction ① in FIG. 1) and a second face 23b that faces the second direction (e.g., the second direction ② in FIG. 1). The second printed circuit board 23 may be disposed to face the first printed circuit board 21, and second electronic components (not illustrated), such as another communication module (e.g., a 5G module), may be mounted on the first face 23a of the second printed circuit board 23.

The second electronic components may be positioned adjacent to the first electronic components and/or may have the shield structure 101 positioned therebetween. The shield structure 101 may include a metallic plate 111 that is disposed between the first electronic components and the second electronic components. The metallic plate 111 may electromagnetically shield the first electronic components and the second electronic components.

The first frame 103 may enclose at least a portion of the first electronic components, and may be connected to the second face 21b of the first printed circuit board 21. The first frame 103 may be formed of a conductive material, and may be electrically connected to the metallic plate 111. The electromagnetic waves, which are generated from the first and second electronic components, may be guided to a ground of the first printed circuit board 21 through the metallic plate 111. For example, the interference of electromagnetic waves may be cut off or blocked by the metallic plate 111.

In addition, the shield structure 101 may include a first side wall that may includes first portions 113 that extend from the peripheral edge of the metallic plate 111 and are formed by being bent in the first direction ①. The first portions 113 may enclose the rim of the first frame 103. First holes 113a may be formed in the first portions 113, and second holes 131 may be formed in the first frame 103 to correspond to the first holes 113a, respectively. The first portions 113 may be fixedly coupled to the first frame 103 by fastening elements, such as, bolts, for example, which may be fastened to the first holes 113a and the second holes 131.

The second frame 105 may enclose at least a portion of the second electronic components, and may be connected to the first face 23a of the second printed circuit board 23. The second frame 105 may be formed of a conductive material, and may be electrically connected to the metallic plate 111. The electromagnetic waves, which are generated from the first and second electronic components, may be guided to a ground of the second printed circuit board 23 through the metallic plate 111. For example, the interference of electromagnetic waves may be cut off or blocked by the metallic plate 111.

In addition, the shield structure 101 may include a second side wall that includes second portions 115 that extend from the peripheral edge of the metallic plate 111 and are formed by being bent in the second direction ②. In addition, the first portions 113 may be arranged to alternate with the second portions 115 along the peripheral edge of the metallic plate 111. In addition, the second portions 115 may enclose the rim of the second frame 105. Third holes 115a may be formed in the second portions 115, and fourth holes 151 may be formed in the second frame 105 to correspond to the third holes 115a, respectively. The second portions 115 may be fixedly coupled to the second frame 105 by bolts that are fastened to the third holes 115a and the fourth holes 151.

Figure 4:
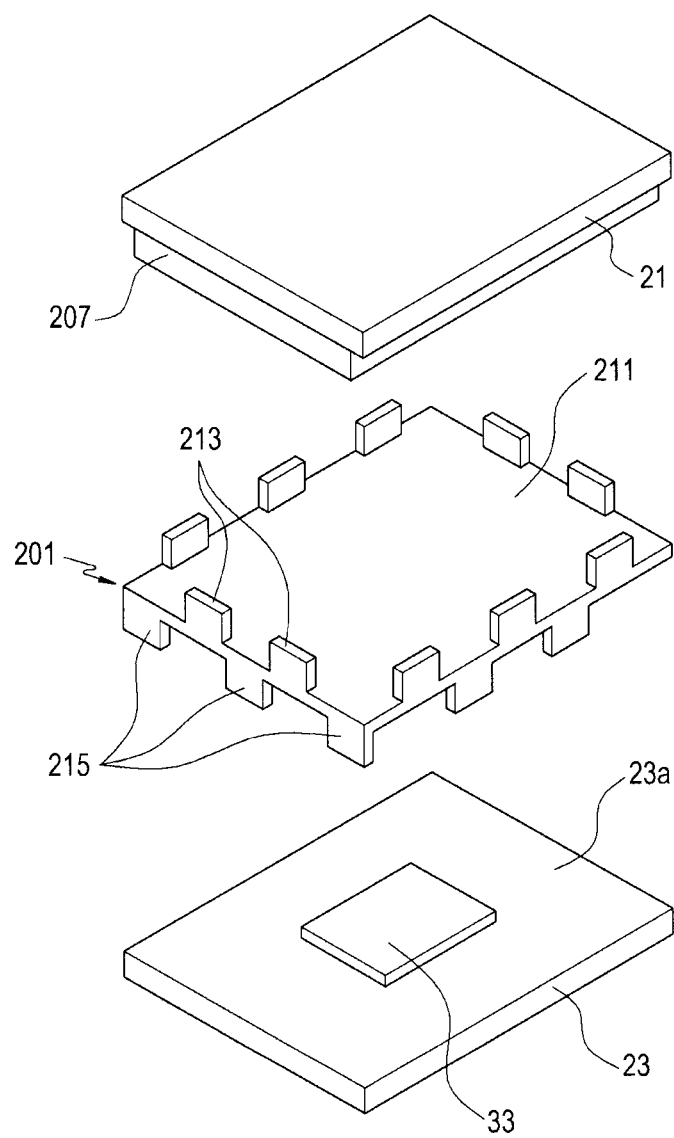
FIG. 4 is an exploded perspective view illustrating main components of an electronic device according to a second one of various embodiments of the present disclosure.
Figure 5:
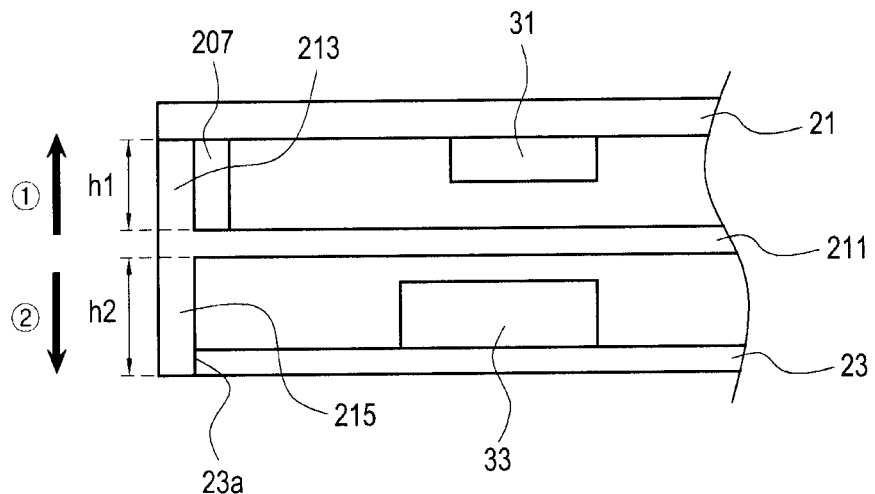
FIG. 5 is a cross-sectional view illustrating the main components of the electronic device according to the second one of various embodiments of the present disclosure, which is illustrated in FIG. 4.

FIG. 4 is an exploded perspective view illustrating main components of an electronic device according to a second one of various embodiments of the present disclosure. FIG. 5 is a cross-sectional view illustrating the main components of the electronic device according to the second one of various embodiments of the present disclosure, which is illustrated in FIG. 4.

In describing various embodiments of the present disclosure below, the components that can be easily understood through the configuration of the preceding embodiment may be denoted by the same reference numerals or the reference numerals may be omitted, and the detailed descriptions thereof may also be omitted to avoid obfuscating the teachings of the present disclosure in unnecessary detail.

Referring to FIGS. 4 and 5, according to a second embodiment of the present disclosure, an electronic device may include a first electronic component 31, a second electronic component 33, a shield structure 201, and a frame 207.

The first electronic component 31 may be disposed on the second face 21b (see FIG. 5) of the first printed circuit board 21, and the second electronic component 33 may be disposed on the first face of the printed circuit board 23 to face the first electronic component.

The shield structure 201 may include a metallic plate 211, first portions 213, and second portions 215, and may be disposed between the first printed circuit board 21 and the second printed circuit board 23.

The frame 207 may enclose at least a portion of the first electronic component 31, and may be connected to the first printed circuit board 21. In addition, the first portions 213 may be connected to and fixedly coupled to the frame 207. In addition, the second portions 215 may contact and be fixedly coupled to a side surface of the second printed circuit board 23. A first height h1 of the first portions 213 may be larger than the height of the first electronic component so that the metallic plate 111 and the first electronic component are spaced apart from each other. A second height h2 of the second portions 215 may be larger than the height of the second electronic component so that the metallic plate 111 and the second electronic component are spaced apart from each other.

The first portions 213 may be formed to have the first height h1 from the metallic plate 211 in the first direction ①, and the second portions 215 may be formed to have the second height h2 from the metallic plate 211 in the second direction ①. For example, in the case where the second portions 215 are connected to the side surface of the second printed circuit board 23, the second height h2 is larger than the height h1 by the thickness of the second printed circuit board 23, so that the distance between the metallic plate 211 and the first printed circuit board 21 and the distance between the metallic plate 211 and the second printed circuit board 23 may be equal to each other.

In addition, the surfaces of the first portions 213 and the second portions 215 may be subjected to different surface treatments such that the surfaces of the first and second portions 213, 215 may have differently textured surfaces. For example, the surfaces of the first portions 213 may be subjected to a surface treatment such that the surfaces have an uneven shape so as to strengthen the fixing force when the first portions 213 are coupled to the first frame 207. In addition, the surfaces of the second portions 215 may be subjected to a surface treatment to form a plurality of protrusions, scratches, or the like so as to strengthen the fixing force when the second portions 215 are coupled to the second printed circuit board 23. In addition, the side surface of the second printed circuit board 23 may be plated so that the side surface of the second printed circuit board 23 can be easily attached to the second portions by soldering.

Figure 6:
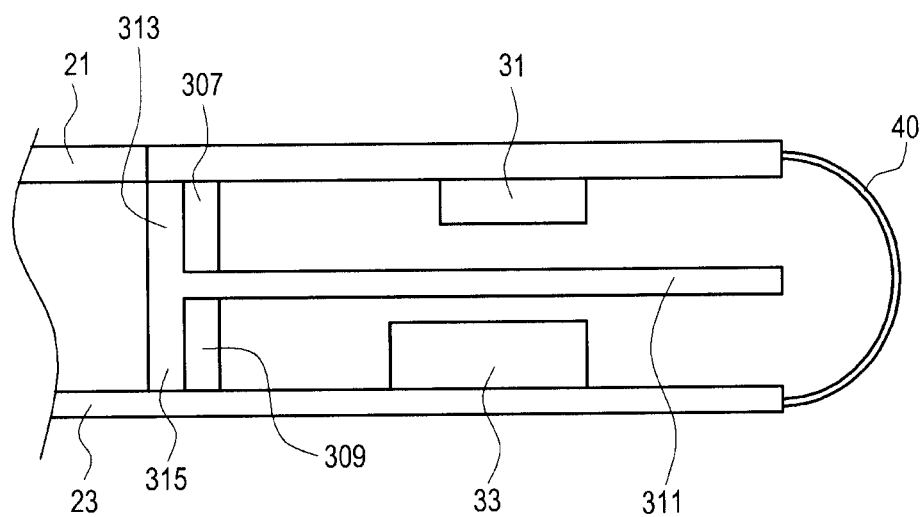
FIG. 6 is a cross-sectional view illustrating main components of an electronic device according to a third one of various embodiments of the present disclosure.

FIG. 6 is a cross-sectional view illustrating the main components of an electronic device according to a third one of various embodiments of the present disclosure.

Referring to FIG. 6, according to the third one of various embodiments of the present disclosure, an electronic device may include shield structures 311, 313, and 315, a first frame 307, a second frame 309, and a flexible printed circuit board 40. In describing various embodiments of the present disclosure below, the components that can be easily understood through the configuration of the preceding embodiments may be denoted by the same reference numerals or the reference numerals may be omitted, and the detailed descriptions thereof may also be omitted to avoid obfuscating the teachings of the present disclosure in unnecessary detail.

The flexible printed circuit board 40 may connect or operably couple the first printed circuit board 21 and the second printed circuit board 23 to each other. Accordingly, in the case where the second electronic component 33 is, for example, a communications module, such as a 5G module, for example, and the first electronic component 31 is, for example, a processor, an electronic signal of the second electronic component 33 may be transferred to the first electronic component 31 via the second printed circuit board 23.

Figure 7:
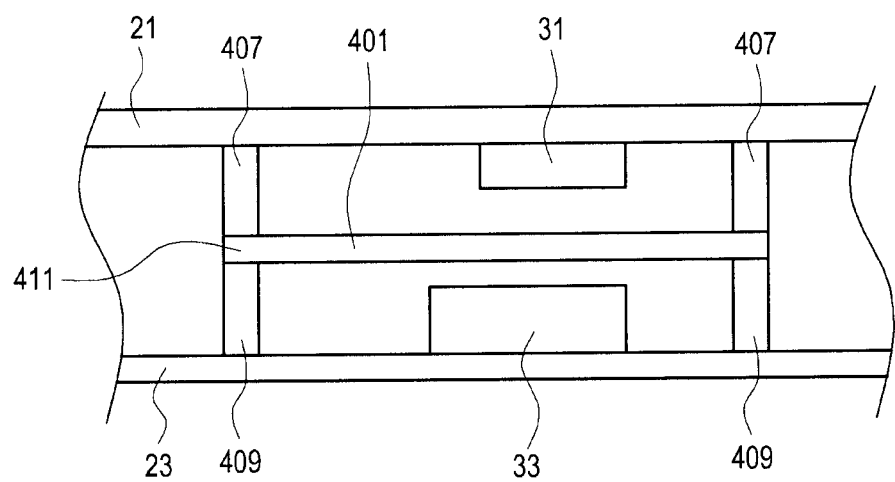
FIG. 7 is a cross-sectional view illustrating main components of an electronic device according to a fourth one of various embodiments of the present disclosure.

FIG. 7 is a cross-sectional view illustrating the main components of an electronic device according to a fourth one of various embodiments of the present disclosure.

Referring to FIG. 7, according to the fourth one of various embodiments of the present disclosure, an electronic device may include a shield structure including a metallic plate 411, a first frame 407, and a second frame 409. In describing various embodiments of the present disclosure below, the components that can be easily understood through the configuration of the preceding embodiments may be denoted by the same reference numerals or the reference numerals may be omitted, and the detailed descriptions thereof may also be omitted to avoid obfuscating the teachings of the present disclosure in unnecessary detail.

The metallic plate 411 may be formed as or includes a conductive film, and may be connected to the facing faces of the first frame 407 and the second frame 409. For example, the opposite side ends of the metallic plate 411, which may be formed as or may include a conductive film, may be formed of an adhesive material to be attached and coupled to the first frame 407 and the second frame 409.

Figure 8:
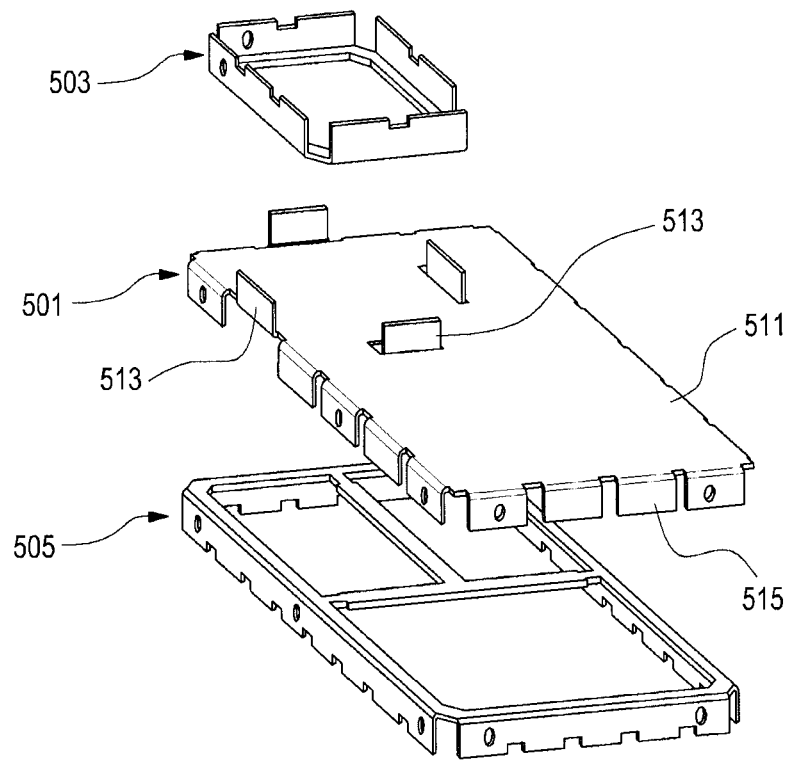
FIG. 8 is an exploded perspective view illustrating a metallic plate and first and second frames of an electronic device according to a fifth one of various embodiments of the present disclosure.
Figure 9:
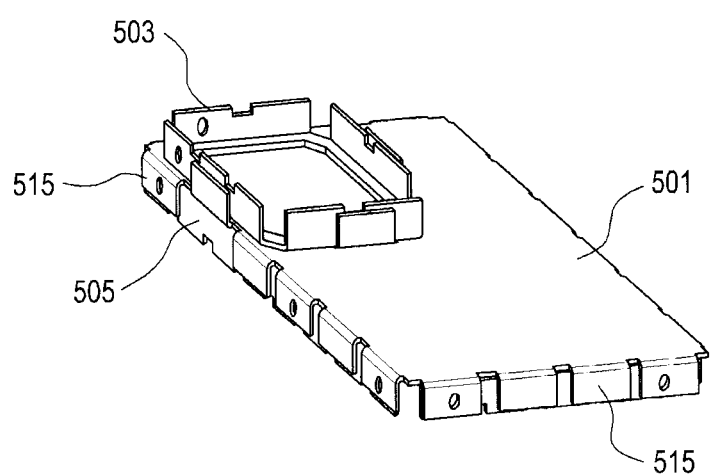
FIG. 9 is a perspective view illustrating a metallic plate and first and second frames of the electronic device according to the fifth one of various embodiments of the present disclosure, which is illustrated in FIG. 8, in a state where the metallic plate and the first and second frames are coupled to each other.

FIG. 8 is an exploded perspective view illustrating a metallic plate and first and second frames of an electronic device according to a fifth one of various embodiments of the present disclosure. FIG. 9 is a perspective view illustrating a metallic plate and first and second frames of the electronic device, which is illustrated in FIG. 8, in a state where the metallic plate and the first and second frames are coupled to each other.

Referring to FIGS. 8 and 9, according to the fifth one of various embodiments of the present disclosure, an electronic device may include a shield structure 501, a first frame 503, and a second frame 505, and the shield structure 501 may include a metallic plate 511, first portions 513, and second portions 515. In describing various embodiments of the present disclosure below, the components that can be easily understood through the configuration of the preceding embodiments may be denoted by the same reference numerals or the reference numerals may be omitted, and the detailed descriptions thereof may also be omitted to avoid obfuscating the teachings of the present disclosure in unnecessary detail.

In the case where the size of the first frame 503 is smaller than that of the second frame 505, the first portions 513 may extend from the metallic plate 511 to correspond to the rim of the first frame 503. In addition, the second portions 515 may extend from the metallic plate 511 to correspond to the rim of the second frame 505, and at least one of the first portions 513 may be arranged to cross at least one of the second portions 515.

As described above, according to various embodiments, there is provided an electronic device that may include: a housing that includes a first face that faces a first direction, and a second face that faces a second direction, which is opposite to the first direction; a first printed circuit board that includes a first face that faces the first direction, and a second face that is included within the housing and faces the second direction; a second printed circuit board that is disposed between the second face of the housing and the second face of the first printed circuit board, and includes a first face that faces the first direction and a second face that faces the second direction; at least one first electronic component that is disposed on the second face of the first printed circuit board; at least one second electronic component that is disposed on the first face of the second printed circuit board to be adjacent to the first electronic component; and a shield structure that electromagnetically shields the first electronic component and the second electronic component. The shield structure may include: a metallic plate that is disposed between the first electronic component and the second electronic component; a first side wall that encloses at least a portion of the first electronic component, and includes a first portion that is formed by a portion that extends from the periphery of the metallic plate and is formed by being bent in the first direction; and a second side wall that encloses at least a portion of the second electronic component, and includes a second portion that is formed by another portion that extends from the periphery of the metallic plate and is formed by being bent in the second direction.

According to various embodiments, the electronic device may further include a first frame that encloses at least a portion of the first electronic component; and a second frame that encloses at least a portion of the second electronic component. One face of the metal plate may be in contact with one face of the first frame, and the other face of the metallic plate may be in contact with one face of the second frame.

According to various embodiments, the first portion of the shield structure may be connected to at least a portion of a side face of the first frame, and the second portion of the shield structure may be connected to at least a portion of a side face of the second frame.

According to various embodiments, the electronic device may further include a frame that encloses at least a portion of the first electronic component. the first portion of the shield structure may be connected to at least a portion of a side face of the frame, and the second portion of the shield structure may be connected to at least a portion of a side face of the second printed circuit board.

According to various embodiments, the surfaces of the first portion and the second portion may be subjected to different surface treatments.

According to various embodiments, the surface of the first portion may be subjected to a surface treatment to have an uneven shape.

According to various embodiments, the surface of the second portion may be subjected to a surface treatment to form a plurality of protrusions or scratches.

According to various embodiments, the first portion and the second portion may be arranged alternately from the metallic plate. The first portions and the second portions may be alternately arranged next to one another and may extend in different directions with respect the metallic plate. For example, the first portions may extend in a first direction and the second portions may extend in a second direction with respect to the metal plate in an alternating fashion.

According to various embodiments, the size of the metallic plate may be equal to or smaller than the size of the second face of the first printed circuit board or the size of the first face of the second printed circuit board.

According to various embodiments, the first portion may be formed to have a first height from the metallic plate in the first direction, and the second portion may be formed to have a second height from the metallic plate in the second direction.

According to various embodiments, the electronic device may further include a flexible printed circuit board that connects the first printed circuit board and the second printed circuit board to each other.

According to various embodiments, the metallic plate may be formed as or include a conductive film.

According to various embodiments, an electronic device may include: a first printed circuit board; a second printed circuit board that is disposed to face the first printed circuit board; at least one first electronic component that is disposed on the first printed circuit board; at least one second electronic component that is disposed on the second printed circuit board while being adjacent to the first electronic component; and a shield structure that electromagnetically shields the first electronic component and the second electronic component. The shield structure may include: a metallic plate that is disposed between the first electronic component and the second electronic component; a first portion that extends from the metallic plate in a first direction that faces the first printed circuit board; and a second portion that extends from the metallic plate in a second direction that is opposite to the first direction.

According to various embodiments, the height of the first portion may be larger than the height of the first electronic component, and the height of the second portion may be larger than the height of the second electronic component.

According to various embodiments, an electronic device may include: a first frame that encloses at least a portion of the first electronic component and is connected to the first printed circuit board; and a second frame that encloses at least a portion of the second electronic component and is connected to the second printed circuit board. The first portion may be connected to the first frame, and the second portion may be connected to the second frame.

According to various embodiments, the size of the first frame may be smaller than the size of the second frame.

According to various embodiments, an electronic device may further include a frame that encloses at least a portion of the first electronic component. The first portion may be connected to the frame, and the second portion may be connected to the second printed circuit board.

According to various embodiments, the first portion and the second portion may be arranged to be next to one another in alternating arrangement along a peripheral edge of the metallic plate.

According to various embodiments, the first portion may be formed to have a first height from the metallic plate in the first direction, and the second portion may be formed to have a second height from the metallic plate in the second direction, and According to various embodiments, an electronic device may further include a flexible printed circuit board that connects the first printed circuit board and the second printed circuit board to each other.

According to various embodiments, the metallic plate may be formed as or include a conductive film.

While the present disclosure has been shown and described with reference to certain embodiments thereof, it will be understood by those skilled in the art that various changes in form and details may be made therein without departing from the spirit and scope of the present disclosure as defined by the appended claims.

What is claimed is:

1. An electronic device comprising:
   a housing including a first face that faces a first direction, and a second face that faces a second direction, the first direction being opposite to the second direction;
   a first printed circuit board including a first face facing in the first direction and a second face facing in the second direction;
   a second printed circuit board that is disposed between the second face of the housing and the second face of the first printed circuit board, the second printed circuit including a first face facing in the first direction and a second face facing in the second direction;
   at least one first electronic component disposed on the second face of the first printed circuit board;
   at least one second electronic component disposed on the first face of the second printed circuit board to be adjacent to the first electronic component;
   a shield structure electromagnetically shielding the first electronic component and the second electronic component,
   wherein the shield structure comprises:
      a metallic plate disposed between the first electronic component and the second electronic component;
      a first side wall enclosing at least a portion of the first electronic component and including a first portion that is formed by a portion extending from the peripheral edge of the metallic plate and is formed by being bent in the first direction; and
      a second side wall enclosing at least a portion of the second electronic component and including a second portion formed by a portion that extending from the peripheral edge of the metallic plate and being formed by being bent in the second direction,
   a first frame enclosing at least a portion of the first electronic component; and
   a second frame enclosing at least a portion of the second electronic component,
   wherein a first face of the metallic plate is in contact with a first face of the first frame and a second face of the metallic plate is in contact with a first face of the second frame, and
   wherein the first portion is connected to at least a portion of a side face of the first frame, and the second portion is connected to at least a portion of a side face of the second frame.

2. The electronic device of claim 1, further comprising:
   a frame enclosing at least a portion of the first electronic component,
   wherein the first portion of the shield structure is connected to at least a portion of a side face of the frame, and the second portion of the shield structure is connected to at least a portion of a side face of the second printed circuit board.

3. The electronic device of claim 2, wherein surfaces of the first portion and the second portion have differently textured surfaces.

4. The electronic device of claim 3, wherein the surface of the first portion has an uneven shape.

5. The electronic device of claim 3, wherein the surface of the second portion has a surface that has a plurality of protrusions or scratches.

6. The electronic device of claim 1, wherein the first portion and the second portion are alternately arranged next to one another and may extend in different directions with respect the metallic plate.

7. The electronic device of claim 1, wherein the size of the metallic plate is equal to or smaller than the size of the second face of the first printed circuit board or the size of the first face of the second printed circuit board.

8. The electronic device of claim 1, wherein the first portion is formed to have a first height from the metallic plate in the first direction, and
the second portion is formed to have a second height from the metallic plate in the second direction.

9. The electronic device of claim 1, further comprising:
a flexible printed circuit board that connects the first printed circuit board and the second printed circuit board to each other.

10. The electronic device of claim 1, wherein the metallic plate includes a conductive film.

11. An electronic device comprising:
a first printed circuit board;
a second printed circuit board that is disposed to face the first printed circuit board;
at least one first electronic component that is disposed on the first printed circuit board;
at least one second electronic component that is disposed on the second printed circuit board while being adjacent to the first electronic component;
a first frame enclosing at least a portion of the first electronic component; and
a shield structure that electromagnetically shields the first electronic component and the second electronic component,
wherein the shield structure includes:
a metallic plate that is disposed between the first electronic component and the second electronic component;
a first portion that extends from the metallic plate in a first direction that is directed to the first printed circuit board; and
a second portion that extends from the metallic plate in a second direction that is opposite to the first direction,
wherein the first portion is connected to at least a portion of a side face of the first frame.

12. The electronic device of claim 11, wherein the height of the first portion is larger than the height of the first electronic component, and
the height of the second portion is larger than the height of the second electronic component.

13. The electronic device of claim 11, further comprising:
a second frame that encloses at least a portion of the second electronic component and is connected to the second printed circuit board, and
wherein the second portion is connected to the second frame.

14. The electronic device of claim 13, wherein the size of the first frame is smaller than the size of the second frame.

15. The electronic device of claim 11, wherein the second portion is connected to the second printed circuit board.

16. The electronic device of claim 11, wherein the first portion and the second portion are arranged next to one another in alternating arrangement along a peripheral edge of the metallic plate.

17. The electronic device of claim 11, wherein the first portion has a first height from the metallic plate in the first direction, and
the second portion is has a second height from the metallic plate in the second direction.

18. The electronic device of claim 11, further comprising:
a flexible printed circuit board connecting the first printed circuit board and the second printed circuit board to each other.

19. The electronic device of claim 11, wherein the metallic plate includes conductive film.

* * * * *